United States Patent
Kawasaki

(10) Patent No.: US 8,655,292 B2
(45) Date of Patent: Feb. 18, 2014

(54) AMPLIFIER CIRCUIT, TRANSMITTER, AND METHOD OF CONTROLLING AMPLIFIER CIRCUIT

(75) Inventor: Toshio Kawasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 9 days.

(21) Appl. No.: 13/328,587

(22) Filed: Dec. 16, 2011

(65) Prior Publication Data

US 2012/0214432 A1   Aug. 23, 2012

(30) Foreign Application Priority Data

Feb. 17, 2011   (JP) .................. 2011-032521

(51) Int. Cl.
  *H01Q 11/12*   (2006.01)
(52) U.S. Cl.
  USPC .......... 455/127.1; 455/91; 455/108; 455/110; 455/127.3; 455/552.1; 375/295; 375/296; 375/297; 375/298; 330/2; 330/10; 330/149; 330/124 R
(58) Field of Classification Search
  USPC .......... 455/91, 108, 110, 127.1, 127.3, 552.1; 375/295–298; 330/2, 10, 149, 124 R
  See application file for complete search history.

(56) References Cited

U.S. PATENT DOCUMENTS

| 5,990,738 | A | * | 11/1999 | Wright et al. ................. | 330/149 |
| 7,711,331 | B2 |   | 5/2010 | Takehara |  |
| 8,463,202 | B2 | * | 6/2013 | Nagayama ...................... | 455/91 |
| 2010/0240331 | A1 | * | 9/2010 | Nagayama ................. | 455/127.1 |
| 2012/0157010 | A1 | * | 6/2012 | Fukuoka et al. ................ | 455/73 |

FOREIGN PATENT DOCUMENTS

JP   2008-028509   2/2008

\* cited by examiner

*Primary Examiner* — Junpeng Chen
(74) *Attorney, Agent, or Firm* — Fujitsu Patent Center

(57) ABSTRACT

A signal separating unit separates an input signal into a first branch signal and a second branch signal in such a manner that, as the amplitude of the input signal decreases, the amplitude of the first branch signal and the second branch signal decreases and the difference between a phase of the first branch signal and a phase of the second branch signal increases and, as the amplitude of the input signal increases, the amplitude of the first branch signal and the second branch signal increases and the difference between the phase of the first branch signal and the phase of the second branch signal decreases. An amplifier amplifies the first branch signal. Another amplifier amplifies the second branch signal. A combining unit combines signals that are output from the amplifiers together, thereby generating an output signal.

6 Claims, 13 Drawing Sheets

AMPLIFIER CIRCUIT, TRANSMITTER, AND METHOD OF CONTROLLING AMPLIFIER CIRCUIT

CROSS-REFERENCE TO RELATED APPLICATION

This application is based upon and claims the benefit of priority of the prior Japanese Patent Application No. 2011-032521, filed on Feb. 17, 2011, the entire contents of which are incorporated herein by reference.

FIELD

The embodiments discussed herein are directed to an amplifier circuit, a transmitter, and a method of controlling the amplifier circuit.

BACKGROUND

The availability of frequency resources has become tight recently, and therefore digital-based high-performance transmittance are being used more and more in the field of wireless communications. A typical high-performance transmission is made using a multilevel QAM (quadrature amplitude modulation) method and an amplifier having high linearity is requested. To reduce the size and power consumption of a wireless transmitting device, an amplifier having high performance operation is requested. As a means of realizing a high-performance linear amplifier, a radio frequency amplifier circuit is proposed that uses a saturated amplifier incorporating LINC (Linear Amplification with Nonlinear Components).

The operation of a conventional radio frequency amplifier circuit using LINC (hereinafter, "LINC-based amplifier circuit") will be explained below. Upon receiving an input signal Sin(t) having envelope variation, the LINC-based amplifier circuit separates the input signal Sin(t) into two phase modulation signals Sc1(t) and Sc2(t) in such a manner that their phase difference is set in accordance with the amplitude and then outputs Sc1(t) and Sc2(t). The signals that are generated by separating the input signal are sometimes called "branch signals". Then, Sc1(t) is converted to an analog signal and the analog signal passes through a filter. After passing through the filter, unnecessary frequency components are suppressed and the component that corresponds to Sc1(t) is extracted. The LINC-based amplifier circuit orthogonally modulates the extracted component that corresponds to Sc1(t), thereby generating a radio frequency signal S1(t) that is an RF signal. The LINC-based amplifier circuit processes Sc2(t) in the same manner, thereby generating S2(t), which is also an RF signal. The LINC-based amplifier circuit includes parallel amplifiers that correspond to S1(t) and S2(t), respectively. S1(t) and S2(t) are amplified by the respective amplifiers, each having the gain G. In this circuit, the amplifiers are used as saturated amplifiers. With this configuration, the respective amplifiers generate amplified radio frequency signals GS1(t) and GS2(t), respectively. After that, the LINC-based amplifier circuit combines the radio frequency signals GS1(t) and GS2(t) together, thereby generating an output radio frequency signal Sout(t). The LINC-based amplifier circuit then outputs the generated Sout(t). As described above, the LINC amplifier circuit generates the output radio frequency signal Sout(t) by amplifying the input signal Sin(t) or performs efficient signal amplification.

Examples of a signal separating method used in a conventional LINC-based amplifier circuit include a method of separating a signal using the following equation 1. In Equation 1, the input signal is expressed in polar coordinates, where x corresponds to Sin(t) in the above description, xa is Sc1 in the above description, and xb is Sc2 in the above description:

$$x = r \cdot e^{j\theta} (r \leq 1)$$
$$xa = e^{j(\theta + \cos^{-1}(r))}$$
$$xb = e^{j(\theta - \cos^{-1}(r))} \quad (1)$$

The symbol r is the amplitude of the input signal. The symbol θ represents the modulated phase of the input signal. The phase angle of the branch signal xa and the phase angle of the branch signal xb are set in such a manner that the difference between the phase of the branch signal xa and the phase of the branch signal xb becomes $2 \times \cos^{-1}(r)$.

FIG. 10 is a constellation diagram of conventional branch signals when the input signal is a two-tone signal. The constellation is generated by plotting a signal in two-dimensional coordinates. The vertical axis of FIG. 10 is a Q component, and the horizontal axis is an I component. The branch signal xa is a signal 901 expressed by a solid line, and the branch signal xb is a signal 902 that is expressed by a dotted line.

A proposed conventional technology relates to a LINC-based amplifier circuit that can amplify a signal with a high efficiency even when the dynamic range is wide and the PAR is high. The conventional LINC-based amplifier circuit calculates the amplitude of a branch signal within a certain interval of an input signal by using the average power within the interval and the maximum power within the interval.

Patent Document 1: Japanese Laid-open Patent Publication No. 2008-28509

If a phase reversal signal, such as a PSK signal, is input to a LINC-based amplifier circuit as an input modulation signal x, branch signals xa and xb that are generated by separating the signal have 180-degrees reversed parts. In other words, the generated branch signals xa and xb have discontinuous parts, which largely increase the bandwidths of the branch signals xa and xb. For example, in FIG. 10, parts close to a point 903 are the 180-degrees reversed parts.

However, because of the Nyquist theorem, it's difficult for the digital branch signals xa and xb to be expressed by using a frequency that is more than half of the sampling frequency. Therefore, when the branch signals illustrated in FIG. 10 are converted by D/A (Digital/Analog) converters into analog signals and then folding components are removed therefrom by using smoothing filters, a signal 904, which is expressed by a solid line in FIG. 11, and a signal 905, which is expressed by a dotted line in FIG. 11, are generated. The signals 904 and 905 are input to respective amplifiers. FIG. 11 is a constellation diagram of conventional signals that are input to amplifiers. The vertical axis of FIG. 11 is the Q component, and the horizontal axis is the I component. As illustrated in FIG. 11, it is found that both the signals 904 and 905 are wavy and large ringing occurs in each of the signals that are input to the amplifiers. In other words, the signals that are input to the amplifiers are different from constant envelope signals. The ringing occurs due to the effect of the 180-degrees reversed parts, such as the point 903. In this example, the signals that are input to the amplifiers include amplitude components due to the effect of the ringing. When a signal having an amplitude component is amplified by an amplifier, due to effects of AM/AM distortion and AM/PM distortion of the amplifier, the combined output radio frequency signal Xout is deteriorated and, therefore, distortion occurs. FIG. 12 is a constellation diagram of conventional signals that are output from the amplifiers and a conventional combined signal. The vertical axis of FIG. 12 is the Q component and the horizontal axis is the I component. The signals that are output from the amplifiers are a signal 906, which is expressed by a solid line, and a signal 907, which is expressed by a dotted line. The combined signal of the signals 906 and 907 is a signal 908, which is expressed by a dashed-dotted line. As illustrated in FIG. 12, distortion occurs in each of the signals 906, 907, and 908.

Because the distortion components depend on the frequencies of the signals that are input to the amplifiers, it is difficult to compensate for them by using a conventional nonlinear compensation circuit (linearizer). Moreover, because the signals that are input to the amplifiers have wide frequency bands, it is difficult to add compensation circuits to the respective amplifiers to compensate for the nonlinear characteristics. FIG. 13 is a constellation diagram of signals that are output from the amplifiers and a conventional combined signal when the conventional LINC-based amplifier circuit additionally has nonlinear compensation circuits. The vertical axis of FIG. 13 is the Q component and the horizontal axis is the I component. The signals that are output from the amplifiers are a signal 909, which is expressed by a solid line, and a signal 910, which is expressed by a dotted line. The combined signal of the signals 909 and 910 is a signal 911, which is expressed by a dashed-dotted line. As illustrated in FIG. 13, distortion occurs in each of the signals 909, 910, and 911.

As described above, because distortion occurs when the conventional signal separating method is used, it is difficult to suppress deterioration of a combined output or an output radio frequency signal.

Moreover, even if the conventional technology is used and the amplitude of a branch signal within a certain interval of an input signal is calculated by using the average power within the interval and the maximum power within the interval, it is still difficult to avoid the occurrence of a discontinuous branch signal and to suppress the occurrence of distortion.

SUMMARY

According to an aspect of an embodiment of the invention, an amplifier circuit includes a signal separating unit that separates an input signal into a first branch signal and a second branch signal in such a manner that, as an amplitude of the input signal decreases, an amplitude of the first branch signal and the second branch decreases and the difference between a phase of the first branch signal and a phase of the second branch signal increases and, as the amplitude of the input signal increases, the amplitude of the first branch signal and the second branch signal increases and the difference between the phase of the first branch signal and the phase of the second branch signal decreases; a first amplifier that amplifies the first branch signal; a second amplifier that amplifies the second branch signal; and a combining unit that combines signals that are output from the first amplifier and the second amplifier together, thereby generating an output signal.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings.

Moreover, the amplifier circuit, the transmitter, and the method of controlling the amplifier circuit of the present invention are not limited to the following embodiments.

[a] First Embodiment

Figure 1:
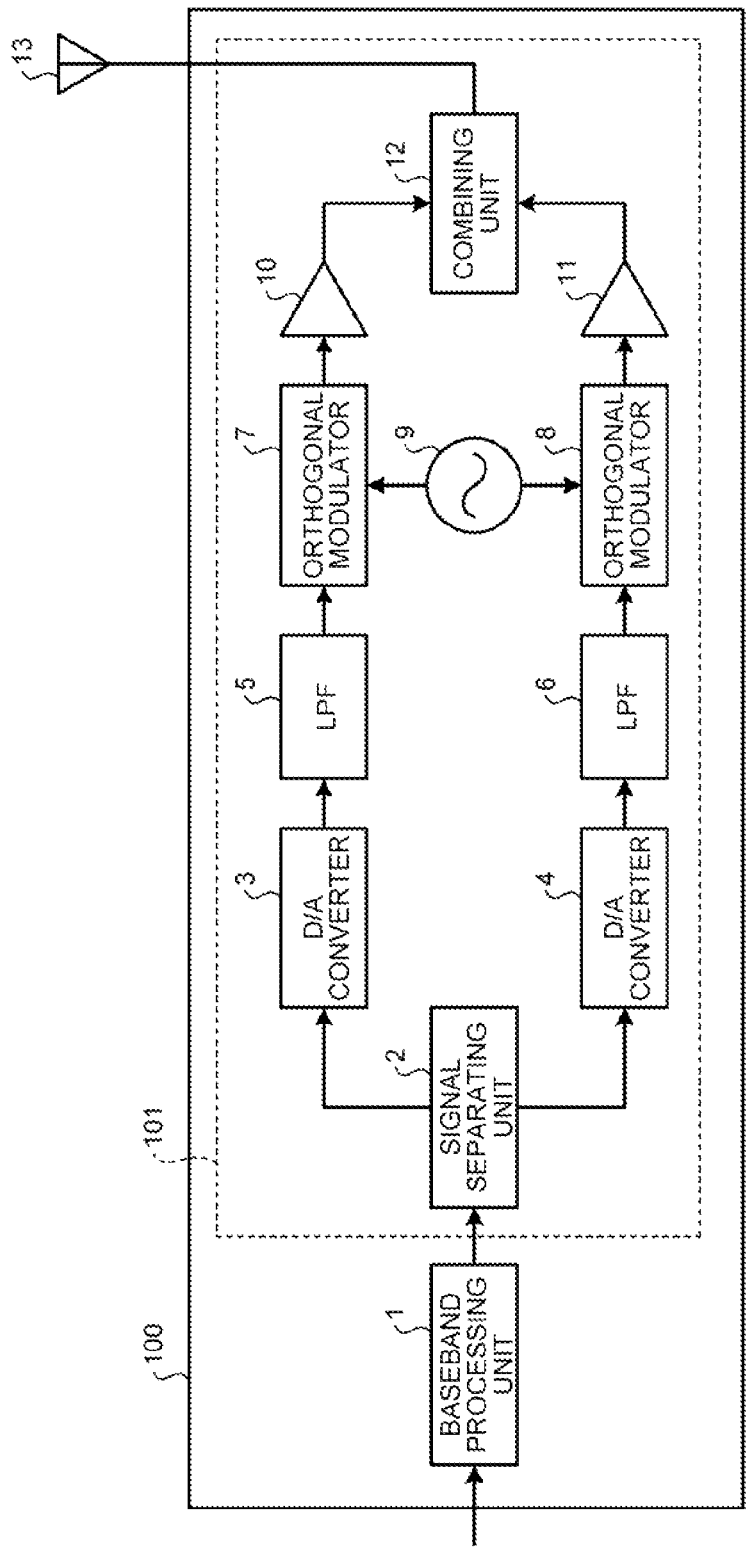
FIG. 1 is a configuration diagram of a transmitter according to the first embodiment.

FIG. 1 is a configuration diagram of a transmitter according to the first embodiment. As illustrated in FIG. 1, a transmitter 100 of the present embodiment includes a baseband processing unit 1, a signal separating unit 2, a D/A converter 3, a D/A converter 4, an LPF (Low Pass Filter) 5, and an LPF 6. The transmitter 100 further includes, as illustrated in FIG. 1, a quadrature modulator 7, an quadrature modulator 8, a local oscillator 9, an amplifier 10, an amplifier 11, a combining unit 12, and an antenna 13. The section that is surrounded by the dotted line including the signal separating unit 2, the D/A converters 3 and 4, the LPFs 5 and 6, the quadrature modulators 7 and 8, the local oscillator 9, the amplifiers 10 and 11, and the combining unit 12 is an amplifier circuit 101. The baseband processing unit 1 and the signal separating unit 2 are implemented by a CPU (Central Processing Unit), a DSP (Digital Signal Processor), etc. The LPFs 5 and 6, the quadrature modulators 7 and 8, the local oscillator 9, the amplifiers 10 and 11, and the combining unit 12 are implemented by an analog circuit.

The baseband processing unit 1 receives transmission data. The baseband processing unit 1 then converts the received transmission data into a baseband signal. After that, the baseband processing unit 1 outputs the baseband signal to the signal separating unit 2.

Figure 2:
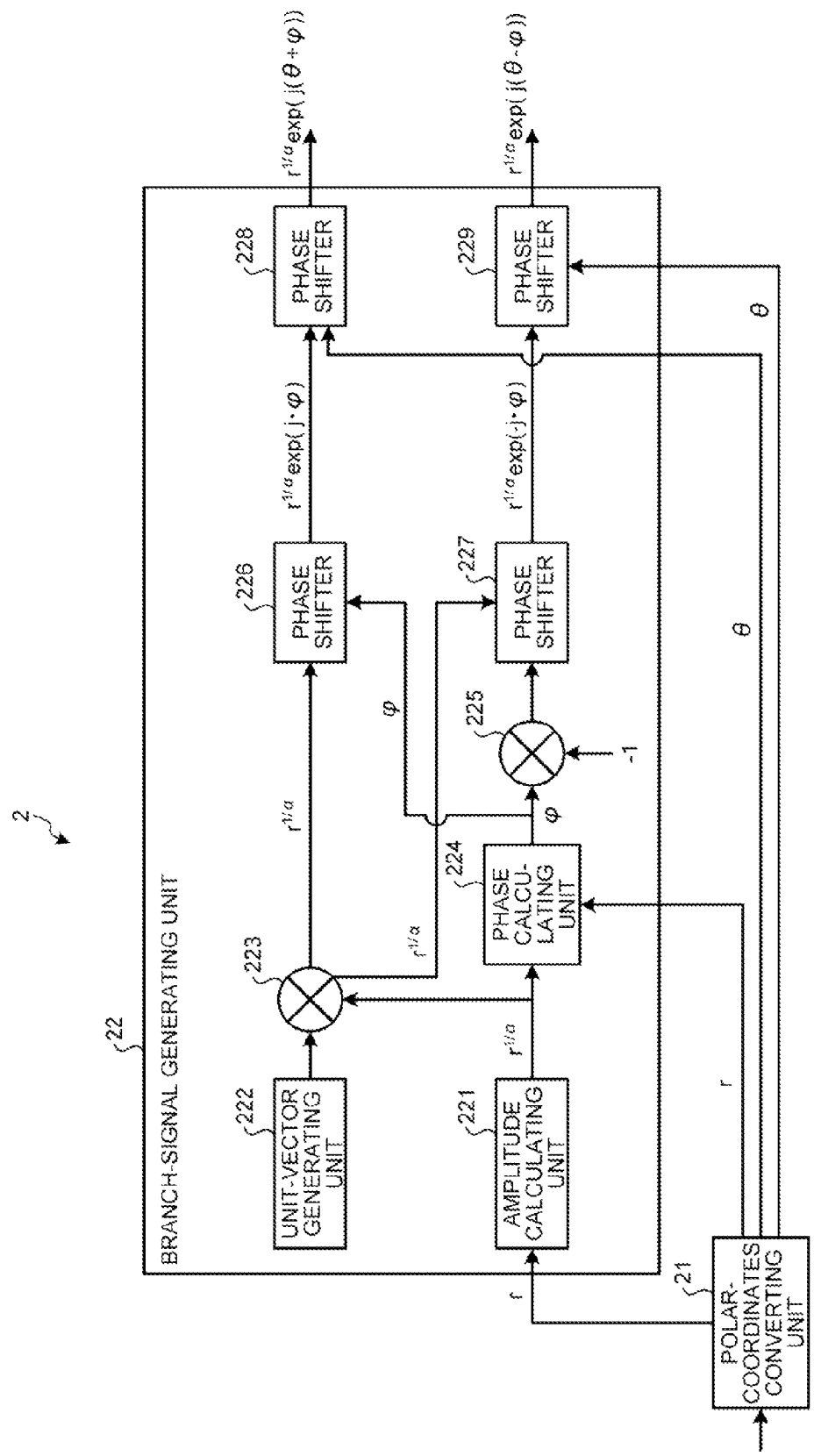
FIG. 2 is a block diagram of the signal separating unit of the amplifier circuit according to the first embodiment.

FIG. 2 is a block diagram of the signal separating unit. As illustrated in FIG. 2, the signal separating unit 2 of the present embodiment includes a polar-coordinates converting unit 21 and a branch-signal generating unit 22. In the following explanation, one branch signal of two branch signals that are generated when the signal separating unit 2 separates an input signal is called "first branch signal" and the other branch signal is called "second branch signal". A first branch signal is amplified by the amplifier 10, and a second branch signal is amplified by the amplifier 11.

The polar-coordinates converting unit 21 receives the baseband signal from the baseband processing unit 1. In the following, a baseband signal that is input to the polar-coordinates converting unit 21 is sometimes called "input signal", simply. The input signal is an I/Q signal expressed in orthogonal coordinates.

The polar-coordinates converting unit 21 performs polar-coordinates conversion with the received input signal. The input signal is, for example, $r \cdot e^{j\theta}$ ($r \leq 1$) in polar coordinates. The polar-coordinates converting unit 21 then calculates, by using the input signal that is expressed in polar coordinates, an amplitude value r and a phase value θ of the input signal. After that, the polar-coordinates converting unit 21 outputs the amplitude value r of the input signal to both a later-described amplitude calculating unit 221 and a later-described phase calculating unit 224 of the branch-signal generating unit 22. The amplitude calculating unit 221 outputs the phase value θ of the input signal to later-described phase shifters 228 and 229 of the branch-signal generating unit 22. The polar-coordinates converting unit 21 is an example of "parameter acquiring unit".

FIG. 2 is a block diagram of the signal separating unit of the amplifier circuit according to the first embodiment. The branch-signal generating unit 22 includes, as illustrated in FIG. 2, the amplitude calculating unit 221, a unit-vector generating unit 222, a multiplier 223, the phase calculating unit 224, a multiplier 225, and phase shifters 226 to 229.

The amplitude calculating unit 221 prestores therein the value of a parameter α to calculate an amplitude value of a branch signal. In the present embodiment, if the efficiency of the amplifier circuit has priority, the value of α is large. If the linearity of the amplifier circuit has priority, the value of α is small. It is preferable that the value of α is decided in accordance with the characteristics, the operating points, and the preferred characteristics of the amplifiers. The amplitude calculating unit 221 receives the amplitude value r of the input signal from the polar-coordinates converting unit 21. The amplitude calculating unit 221 then calculates, by using the received amplitude value r of the input signal, an amplitude value $r^{1/\alpha}$ of a branch signal. After that, the amplitude calculating unit 221 outputs the calculated amplitude value $r^{1/\alpha}$ of the branch signal to both the multiplier 223 and the phase calculating unit 224.

The unit-vector generating unit 222 generates a unit vector that is expressed by 1+j·0. The unit vector is a signal having an amplitude value 1 and a phase amount zero. The unit-vector generating unit 222 then outputs the generated unit vector to the multiplier 223.

The multiplier 223 receives the amplitude value $r^{1/\alpha}$ of the branch signal from the amplitude calculating unit 221. The multiplier 223 also receives the unit vector from the unit-vector generating unit 222. The multiplier 223 then multiplies the unit vector and the amplitude value $r^{1/\alpha}$ of the branch signal together. Thereby, a vector that is expressed by $r^{1/\alpha+j \cdot 0}$ is generated. After that, the multiplier 223 outputs the product or the generated vector to the phase shifters 226 and 227.

The phase calculating unit 224 receives the amplitude value r of the input signal from the polar-coordinates converting unit 21. The phase calculating unit 224 also receives the amplitude value $r^{1/\alpha}$ of the branch signal from the amplitude calculating unit 221.

The phase calculating unit 224 then calculates, by using the received amplitude value r of the input signal and the received amplitude value $r^{1/\alpha}$ of the branch signal, a phase value $\cos^{-1}(r/r^{1/\alpha})$ of a first branch signal. After that, the phase calculating unit 224 outputs the calculated phase value $\cos^{-1}(r/r^{1/\alpha})$ of the first branch signal to both the phase shifter 226 and the multiplier 225. In FIG. 2, φ is $\cos^{-1}(r/r^{1/\alpha})$. In the following, the expression of FIG. 2 is described after an equal mark within parentheses that are subsequent to an equation.

The phase shifter 226 receives the amplitude value $r^{1/\alpha}$ of the branch signal from the multiplier 223. The phase shifter 226 also receives the phase value $\cos^{-1}(r/r^{1/\alpha})$ (=φ) of the first branch signal from the phase calculating unit 224.

The phase shifter 226 then generates a signal $r^{1/\alpha}\exp(j \cdot \cos^{-1}(r/r^{1/\alpha}))$ (=$r^{1/\alpha}\exp(j \cdot \phi)$) that has the amplitude value $r^{1/\alpha}$ and the phase value $\cos^{-1}(r/r^{1/\alpha})$ (=φ). After that, the phase shifter 226 outputs the generated signal $r^{1/\alpha}\exp(j \cdot \cos^{-1}(r/r^{1/\alpha}))$ (=$r^{1/\alpha}\exp(j \cdot \phi)$) to the phase shifter 228. The phase shifter 226 is an example of "first phase shifter".

The phase shifter 228 receives the phase value φ of the input signal from the polar-coordinates converting unit 21. The phase shifter 228 also receives the signal $r^{1/\alpha}\exp(j \cdot \cos^{-1}(r/r^{1/\alpha}))$ (=$r^{1/\alpha}\exp(j \cdot \phi)$) from the phase shifter 226.

The phase shifter 228 then shifts the phase of the signal that is received from the phase shifter 226 by the phase value θ of the input signal. This phase shift corresponds to rotating, on polar coordinates, the vector of the signal that is received from the phase shifter 226 by θ degrees. The phase shifter 228 thus calculates the first branch signal of $r^{1/\alpha}\exp(j(\theta+\cos^{-1}(r/r^{1/\alpha})))$ (=$r^{1/\alpha}\exp(j(\theta+\phi))$). After that, the phase shifter 228 outputs the first branch signal of $r^{1/\alpha}\exp(j(\theta+\cos^{-1}(r/r^{1/\alpha})))$ (=$r^{1/\alpha}\exp(j(\theta+\phi))$) to the D/A converter 3 (see FIG. 1). The phase shifter 228 is an example of "third phase shifter".

The multiplier 225 receives the phase value $\cos^{-1}(r/r^{1/\alpha})$ (=φ) of the first branch signal from the phase calculating unit 224. The multiplier 225 then multiplies the received phase value $\cos^{-1}(r/r^{1/\alpha})$ (=φ) of the first branch signal by −1, thereby inverting the sign and calculating a phase value $-\cos^{-1}(r/r^{1/\alpha})$ (=−φ) of a second branch signal. After that, the multiplier 225 outputs the phase value $-\cos^{-1}(r/r^{1/\alpha})$ (=−φ) of the second branch signal to the phase shifter 227. The multiplier 225 is an example of "phase inverting unit".

The phase shifter 227 receives the amplitude value $r^{1/\alpha}$ of the branch signal from the multiplier 223. The phase shifter 227 also receives the phase value $-\cos^{-1}(r/r^{1/\alpha})$ (=−φ) of the second branch signal from the multiplier 225.

The phase shifter 227 then generates a signal $r^{1/\alpha}\exp(-j \cdot \cos^{-1}(r/r^{1/\alpha}))$ (=$r^{1/\alpha}\exp(-j \cdot \phi)$) that has the amplitude value $r^{1/\alpha}$ and the phase value $-\cos^{-1}(r/r^{1/\alpha})$ (=−φ). After that, the phase shifter 227 outputs the generated signal $r^{1/\alpha}\exp(-j \cdot \cos^{-1}(r/r^{1/\alpha}))$ (=$r^{1/\alpha}\exp(-j \cdot \phi)$) to the phase shifter 229. The phase shifter 227 is an example of "second phase shifter".

The phase shifter 229 receives the phase value θ of the input signal from the polar-coordinates converting unit 21. The phase shifter 229 also receives the signal $r^{1/\alpha}\exp(-j \cdot \cos^{-1}(r/r^{1/\alpha}))$ (=$r^{1/\alpha}\exp(-j \cdot \phi)$) from the phase shifter 227.

The phase shifter 229 then shifts the phase of the signal that is received from the phase shifter 227 by the phase value of the input signal. The phase shifter 229 thus calculates the second branch signal of $r^{1/\alpha}\exp(j(\theta-\cos^{-1}(r/r^{1/\alpha})))$ (=$r^{1/\alpha}\exp(j(\theta-$ φ))). After that, the phase shifter 229 outputs the second branch signal of $r^{1/\alpha}\exp(j(\theta-\cos^{-1}(r/r^{1/\alpha})))$ $(=r^{1/\alpha}\exp(j(\theta-\phi))$ to the D/A converter 4 (see FIG. 1). The phase shifter 229 is an example of "fourth phase shifter".

Figure 3:
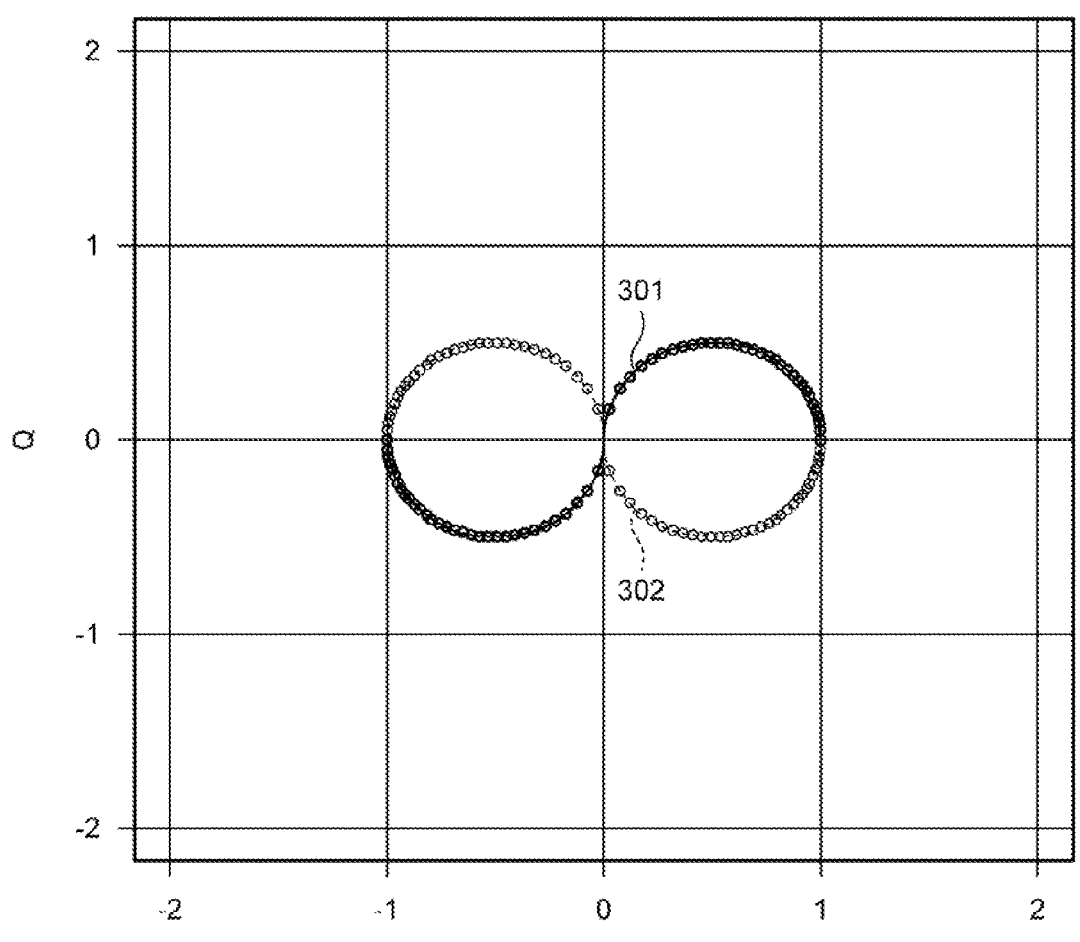
FIG. 3 is a constellation diagram of branch signals that are output from the signal separating unit.

As described above, the signal separating unit 2 outputs the first branch signal of $r^{1/\alpha}\exp(j(\theta+\cos^{-1}(r/r^{1/\alpha})))$ and the second branch signal of $r^{1/\alpha}\exp(j(\theta-\cos^{-1}(r/r^{1/\alpha})))$. The constellations of the two signals are illustrated in FIG. 3. FIG. 3 is a constellation diagram of the branch signals that are output from the signal separating unit. The vertical axis of FIG. 3 is the Q component, and the horizontal axis is the I component. The constellation of the first branch signal is expressed by a solid line 301. The constellation of the second branch signal is expressed by a dotted line 302. It is noted that both the lines 301 and 302 are actually series of discontinuous points at present because both the first branch signal and the second branch signal are digital signals. The solid line 301 and the dotted line 302 are generated, for easy understanding of the outlines of the shapes of the first branch signal and the second branch signal, by smoothly connecting points of the respective signals that are plotted on two-dimensional coordinates together. Both the solid line 301 and the dotted line 302 are continuous and smooth curves having no discontinuous part.

The first branch signal and the second branch signal can be expressed in the following equation 2, respectively:

$$xa = r^{1/\alpha} e^{j(\theta+\cos^{-1}(r/r^{1/\alpha}))}$$

$$xb = r^{1/\alpha} e^{j(\theta-\cos^{-1}(r/r^{1/\alpha}))} \quad (2)$$

Referring back to FIG. 1, the D/A converter 3 receives the first branch signal of $r^{1/\alpha}\exp(j(\theta+\cos^{-1}(r/r^{1/\alpha})))$ from the phase shifter 228. The D/A converter 3 then converts the received first branch signal into an analog signal. After that, the D/A converter 3 outputs the analog first branch signal to the LPF 5.

The LPF 5 is a smoothing filter. The LPF 5 receives the analog first branch signal from the D/A converter 3. The LPF 5 then filter-processes the received first branch signal, thereby removing folding frequency components. After that, the LPF 5 outputs the filter-processed first branch signal to the quadrature modulator 7.

The quadrature modulator 7 receives the filter-processed first branch signal from the LPF 5. The quadrature modulator 7 then modulates the first branch signal by using a carrier-wave signal that is supplied from the local oscillator 9. After that, the quadrature modulator 7 outputs the modulated first branch signal to the amplifier 10.

The amplifier 10 receives the modulated first branch signal from the quadrature modulator 7. The amplifier 10 then amplified the received first branch signal. After that, the amplifier 10 outputs the amplified first branch signal to the combining unit 12. The amplifier 10 is an example of "first amplifier".

The D/A converter 4 receives the second branch signal of $r^{1/\alpha}\exp(j(\theta-\cos^{-1}(r/r^{1/\alpha})))$ from the phase shifter 229. The D/A converter 4 then converts the received second branch signal into an analog signal. After that, the D/A converter 4 outputs the analog second branch signal to the LPF 6.

The LPF 6 is a smoothing filter. The LPF 6 receives the analog second branch signal from the D/A converter 4. The LPF 6 then filter-processes the received second branch signal, thereby removing folding frequency components. After that, The LPF 6 outputs the filter-processed second branch signal to the quadrature modulator 8.

The quadrature modulator 8 receives the filter-processed second branch signal from the LPF 6. The quadrature modulator 8 then modulates the second branch signal by using a carrier-wave signal that is supplied from the local oscillator 9, thereby generating an RF signal. After that, the quadrature modulator 8 outputs the modulated second branch signal to the amplifier 11.

The amplifier 11 receives the modulated second branch signal from the quadrature modulator 8. The amplifier 11 then amplifies the received second branch signal. After that, the amplifier 11 outputs the amplified second branch signal to the combining unit 12. The amplifier 11 is an example of "second amplifier".

The combining unit 12 received the amplified first branch signal from the amplifier 10. The combining unit 12 also receives the amplified second branch signal from the amplifier 11. The combining unit 12 then combines the first branch signal and the second branch signal, both being RF signals, together, thereby generating a transmission signal. After that, the combining unit 12 transmits the generated transmission signal to an external device via the antenna 13.

Figure 4:
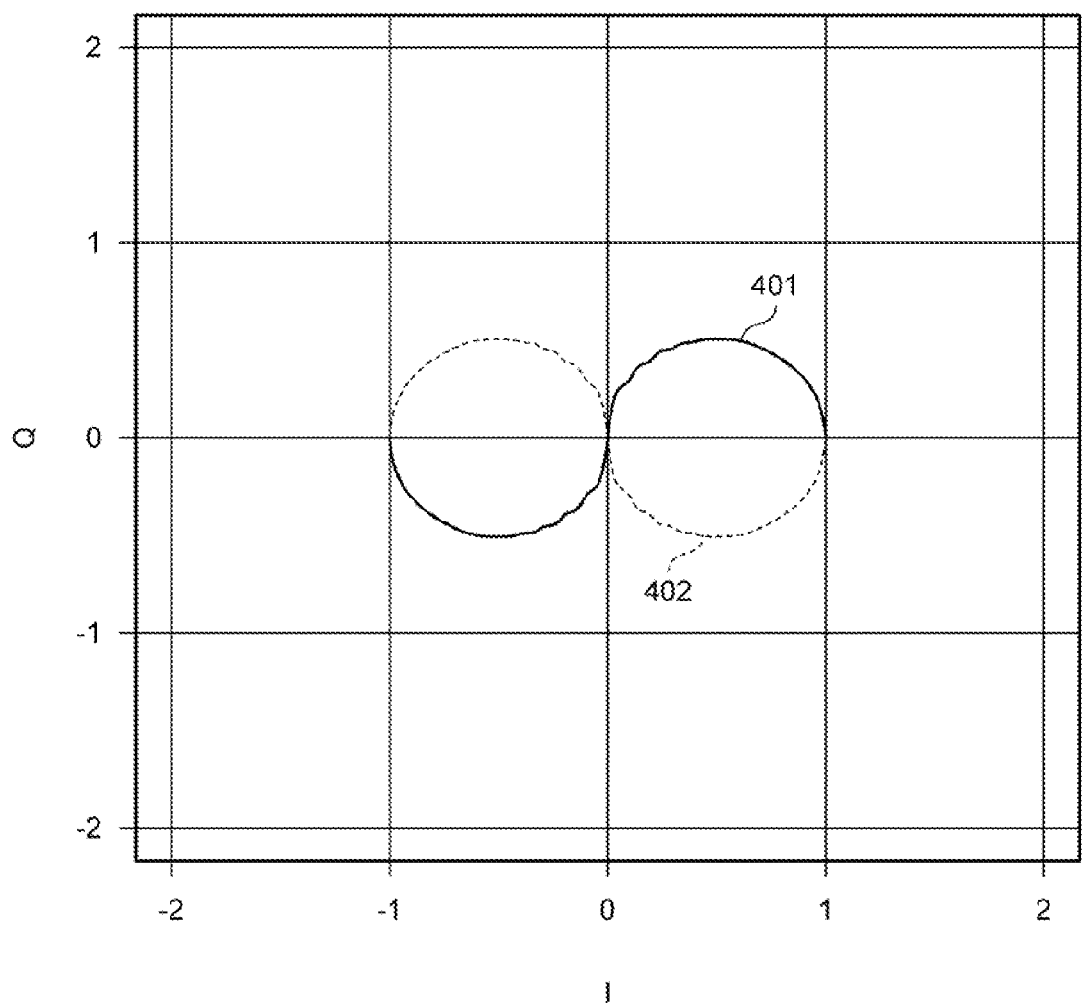
FIG. 4 is a constellation diagram of a first branch signal and a second branch signal that are input to the respective amplifiers.

FIG. 4 is a constellation diagram of the first branch signal and the second branch signal that are input to the respective amplifiers. The vertical axis of FIG. 4 is the Q component, and the horizontal axis is the I component. The constellation of the first branch signal that is input to the amplifier 10 is expressed by a solid line 401. The constellation of the second branch signal that is input to the amplifier 11 is expressed by a dotted line 402. Both of the constellation of the first branch signal and the constellation of the second branch signal have, as illustrated in FIG. 4, smooth and continuous curves. In other words, it is found that ringing is suppressed in each of the first branch signal and the second branch signal that are input to the respective amplifiers.

Figure 5:
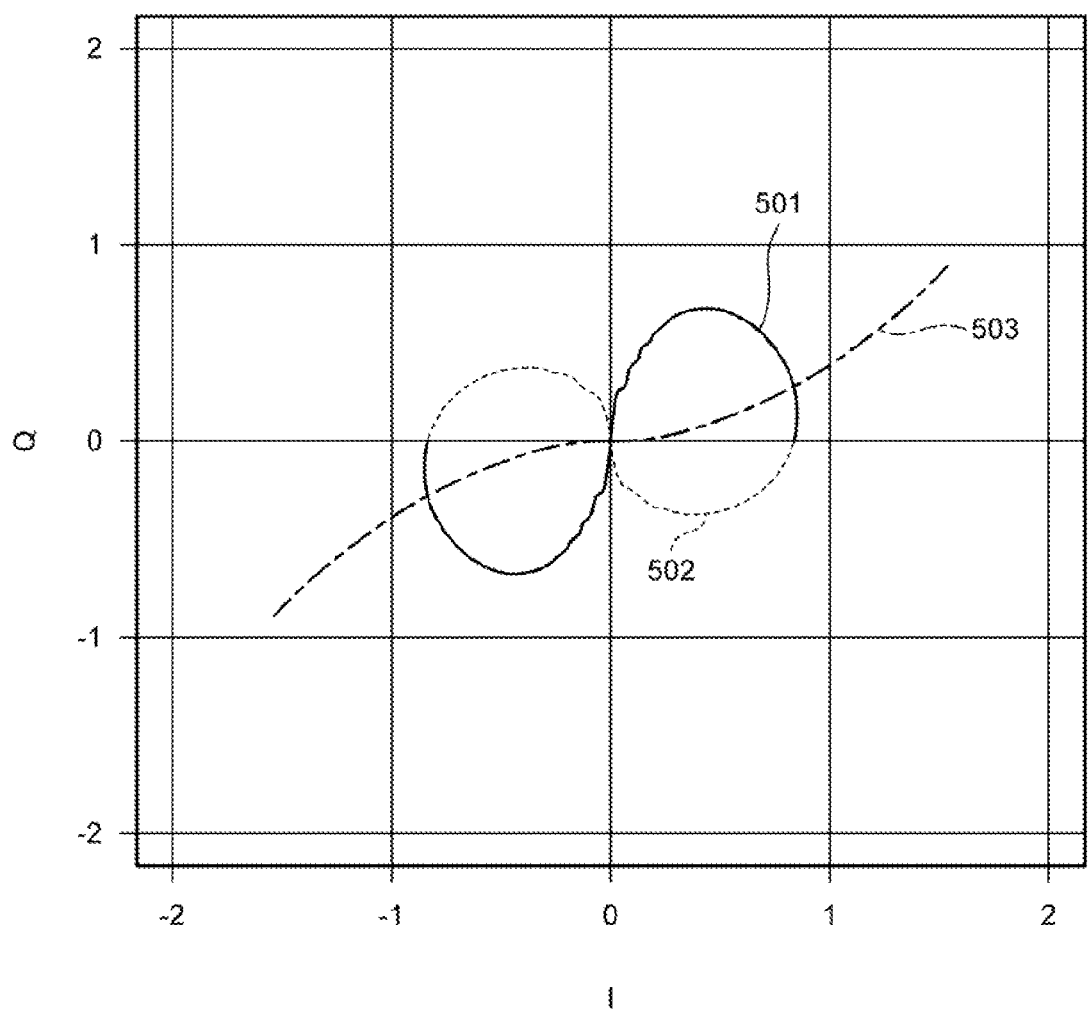
FIG. 5 is a constellation diagram of signals that are output from the respective amplifiers and a transmission signal.

FIG. 5 is a constellation diagram of signals that are output from the respective amplifiers and the transmission signal. The vertical axis of FIG. 5 is the Q component, and the horizontal axis is the I component. The first branch signal that is output from the amplifier 10 is expressed by a solid line 501. The second branch signal that is output from the amplifier 11 is expressed by a dotted line 502. The transmission signal that is generated by the combining unit 12 is expressed by a dashed-dotted line 503. Any of the solid line 501, the dotted line 502, and the dashed-dotted line 503 has almost no wave. In other words, it is found that ringing is suppressed in each of the first branch signal and the second branch signal, which are output from the respective amplifiers. It is also found that ringing is suppressed in the transmission signal that is generated by combining the first branch signal and the second branch signal together.

Figure 6:
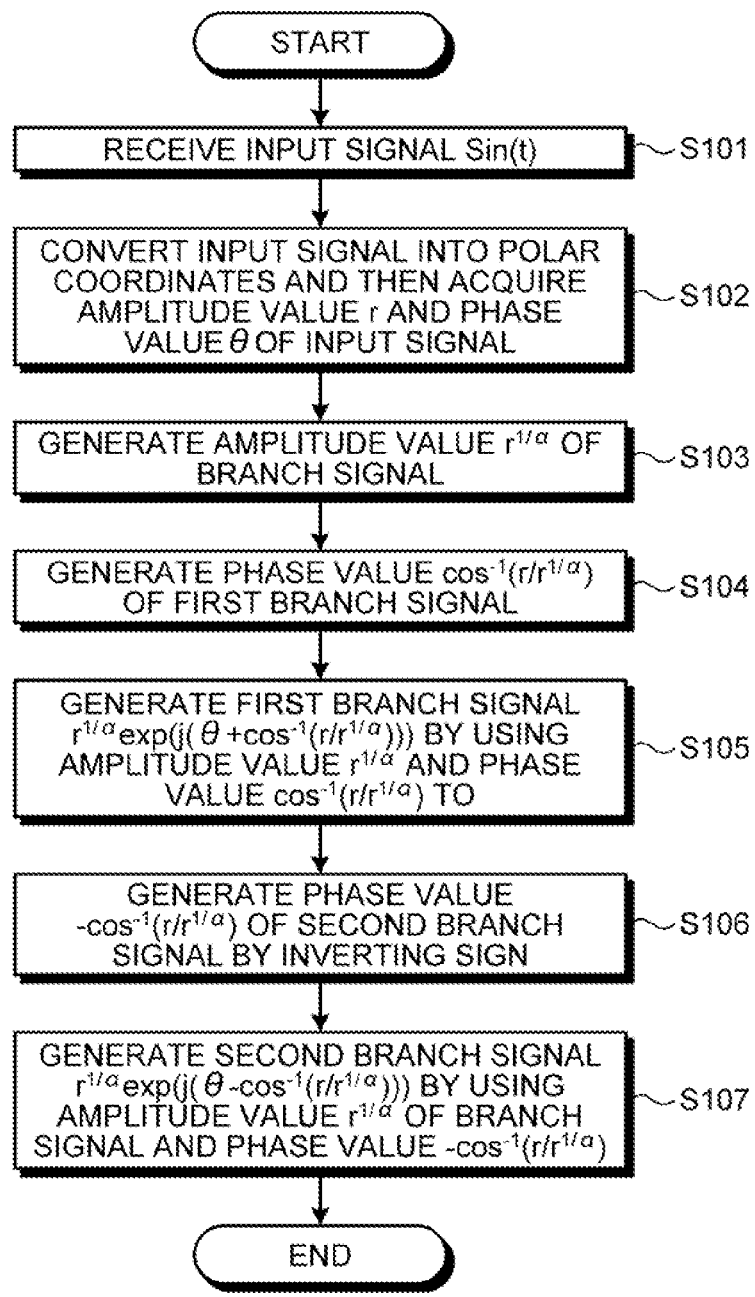
FIG. 6 is a flowchart of a process in which the amplifier circuit generates branch signals according to the first embodiment.

The process in which the amplifier circuit generates branch signals will be explained according to the present embodiment with reference to FIG. 6. FIG. 6 is a flowchart of a process in which the amplifier circuit generates branch signals according to the first embodiment.

The polar-coordinates converting unit 21 receives an input signal (Step S101). At Step S101, the input signal is Sin(t) that is expressed in orthogonal coordinates.

The polar-coordinates converting unit 21 then converts the input signal Sin(t) that is expressed in orthogonal coordinates into polar coordinates. After the conversion, the input signal is expressed as $r \cdot \exp(j\theta)$. After that, the polar-coordinates converting unit 21 acquires the amplitude value r of the input signal and the phase value θ of the input signal (Step S102).

The amplitude calculating unit 221 receives the amplitude value r of the input signal from the polar-coordinates converting unit 21. The amplitude calculating unit 221 then generates, by using α that is prestored therein, an amplitude value $r^{1/\alpha}$ of a branch signal (Step S103).

The phase calculating unit 224 receives the amplitude value r of the input signal from the polar-coordinates converting unit 21. The phase calculating unit 224 also receives the amplitude value $r^{1/\alpha}$ of the branch signal from the amplitude calculating unit 221. The phase calculating unit 224 then generates a phase value $\cos^{-1}(r/r^{1/\alpha})$ of a first branch signal (Step S104).

The phase shifter 226 then generates, by using the amplitude value $r^{1/\alpha}$ of the branch signal and the phase value $\cos^{-1}(r/r^{1/\alpha})$ of the first branch signal, a signal $r^{1/\alpha}\exp(j\cos^{-1}(r/r^{1/\alpha}))$. Subsequently, the phase shifter 226 shifts the signal $r^{1/\alpha}\exp(j\cos^{-1}(r/r^{1/\alpha}))$ by the phase value θ of the input signal, thereby generating a first branch signal of $r^{1/\alpha}\exp(j(\theta+\cos^{-1}(r/r^{1/\alpha})))$ (Step S105).

The multiplier 225 receives the phase value $\cos^{-1}(r/r^{1/\alpha})$ of the first branch signal from the phase calculating unit 224. The multiplier 225 then multiplies the received phase value $\cos^{-1}(r/r^{1/\alpha})$ of the first branch signal by −1, thereby inverting the sign and calculating a phase value $-\cos^{-1}(r/r^{1/\alpha})$ of a second branch signal (Step S106).

The phase shifter 227 generates, by using the amplitude value $r^{1/\alpha}$ of the branch signal and the phase value $-\cos^{-1}(r/r^{1/\alpha})$ of the second branch signal, a signal $r^{1/\alpha}\exp(-j\cos^{-1}(r/r^{1/\alpha}))$. Subsequently, the phase shifter 227 shifts the signal $r^{1/\alpha}\exp(-j\cos^{-1}(r/r^{1/\alpha}))$ by the phase value θ of the input signal, thereby generating a second branch signal of $r^{1/\alpha}\exp(j(\theta-\cos^{-1}(r/r^{1/\alpha})))$ (Step S107).

For convenience of explanation, in the flowchart of FIG. 6, the first branch signal is generated first and then the second branch signal is generated; however, actually, generation of the first branch signal and generation of the second branch signal are performed in parallel.

As described above, the amplifier circuit according to the present embodiment enables reduction of ringing occurring in the branch signals that are input to the amplifiers. Therefore, the amplifier circuit can reduce deterioration of the transmission signal that is an output radio frequency signal generated by combining the branch signals together.

Although, in the above explanation, the amplitude value of the branch signal is $r^{1/\alpha}$, the value is not limited thereto. The amplitude value of the branch signal is a polynomial of r, i.e., f(r) in which as r comes closer to 0, f(r) comes closer to 0, and any function f(x) that satisfies |f(r)|≤1 can be used. When the amplitude value of the branch signal is f(r), the phase value of the first branch signal is expressed to be $\cos^{-1}(r/f(x))$ and the phase value of the second branch signal is expressed to be $-\cos^{-1}(r/f(x))$. In this example, the first branch signal is expressed to be $f(x)\exp(j(\theta+\cos^{-1}(r/f(x))))$. The second branch signal is expressed to be $f(x)\exp(j(\theta-\cos^{-1}(r/f(x))))$.

[b] Second Embodiment

Figure 7:
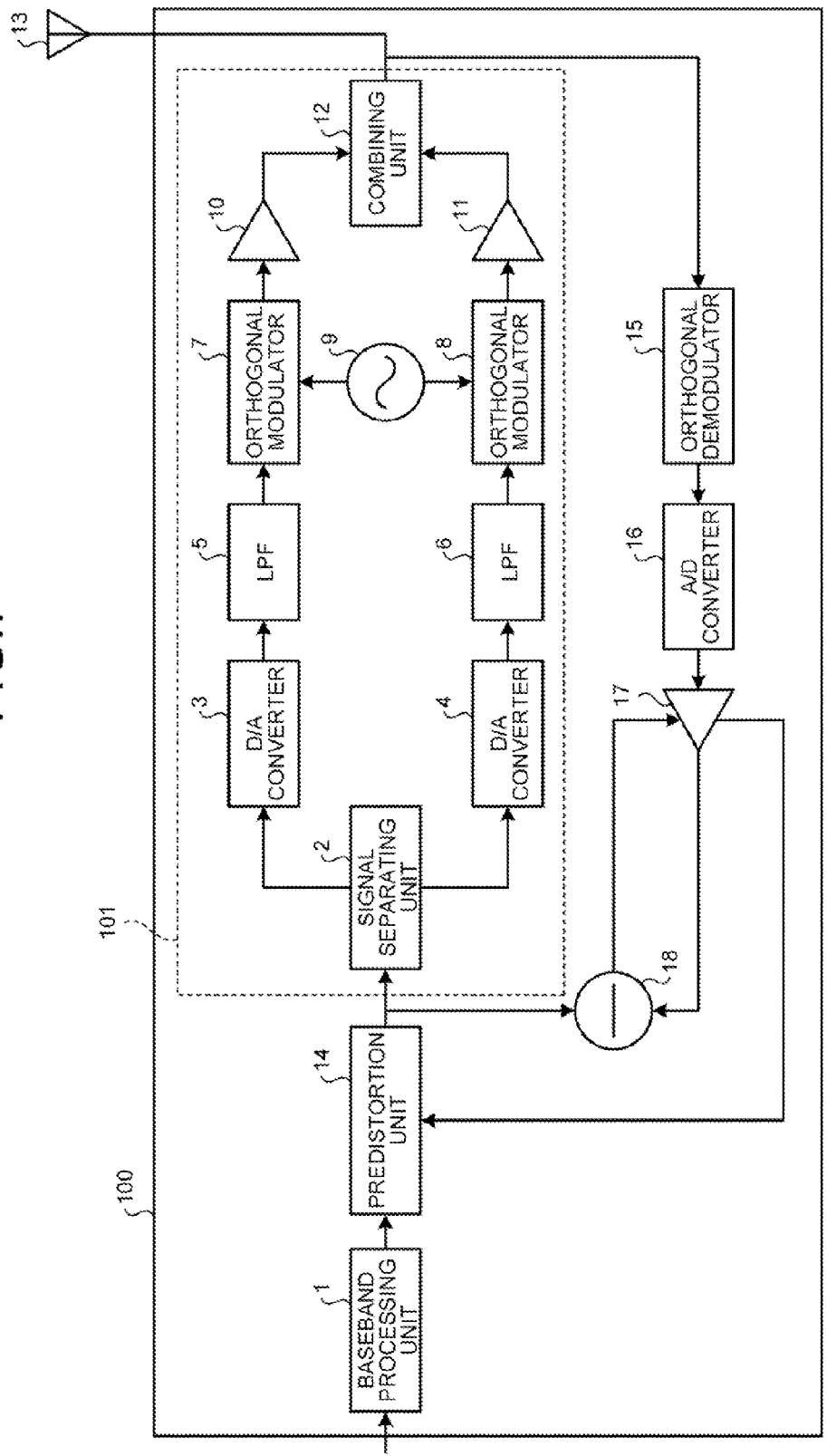
FIG. 7 is a configuration diagram of a transmitter according to the second embodiment.

FIG. 7 is a configuration diagram of a transmitter according to the second embodiment. The transmitter according to the present embodiment further includes, in addition to the components of the first embodiment, a nonlinear compensation circuit that is an indirect leaning circuit. The following explanation focuses on the nonlinear compensation circuit. The components of FIG. 7 denoted with the same reference numerals as those of the components of FIG. 2 have the same functions unless otherwise specified. In the following, a set of the signal separating unit 2, the D/A converters 3 and 4, the LPFs 5 and 6, the quadrature modulators 7 and 8, the amplifiers 10 and 11, and the combining unit 12 is sometimes called "amplifying unit".

The transmitter according to the present embodiment includes, as illustrated in FIG. 7, not only the components of the transmitter of the first embodiment but also a predistortion unit 14, an quadrature demodulator 15, an A/D converter 16, an amplifier model 17, and a subtractor 18. The amplifier model 17 and the subtractor 18 are implemented by a digital circuit, a CPU, a DSP, etc. The quadrature demodulator 15 is implemented by an analog circuit.

The predistortion unit 14 receives a coefficient (characteristic that is reverse to the nonlinear characteristic of the amplifier circuit 101) that is calculated by the amplifier model 17. As described later, the amplifier model 17 calculates the coefficient in such a manner that the power of an error signal becomes the lowest possibly. The predistortion unit 14 generates a predistortion signal by adding the characteristic reverse to the nonlinear characteristic of the amplifying unit. After that, the predistortion unit 14 outputs the generated predistortion signal to the signal separating unit 2. The predistortion unit 14 outputs the generated predistortion signal to the subtractor 18, too.

The operations of the signal separating unit 2, the D/A converters 3 and 4, the LPFs 5 and 6, the quadrature modulators 7 and 8, the amplifiers 10 and 11, and the combining unit 12 are almost the same as the operations of those components of the first embodiment except that the input signal is the predistortion signal. It is noted that the transmission signal that is output from the combining unit 12 is branched by a coupler (not illustrated) and then supplied to the quadrature demodulator 15 as a feedback signal.

The quadrature demodulator 15 demodulates the received feedback signal, thereby generating a feedback baseband signal. The quadrature demodulator 15 then outputs the feedback baseband signal to the A/D converter 16.

The A/D converter 16 receives the feedback baseband signal from the quadrature demodulator 15. The A/D converter 16 then converts the received feedback baseband signal into a digital signal sequence. After that, the A/D converter 16 outputs the feedback baseband signal to the amplifier model 17 as the digital signal sequence.

The amplifier model 17 receives the feedback baseband signal from the A/D converter 16 as the digital signal sequence. The amplifier model 17 then nonlinear-amplifies the received feedback baseband signal. After that, the amplifier model 17 outputs the amplified feedback baseband signal to the subtractor 18.

The amplifier model 17 also receives an error signal from the subtractor 18. The amplifier model 17 then calculates a gain and a coefficient in such a manner that the power of the error signal becomes the lowest possibly. The calculated gain and the calculated coefficient indicate characteristics reverse to the characteristics of the amplifier circuit 101. After that, the amplifier model 17 outputs the calculated coefficient to the predistortion unit 14.

The subtractor 18 receives the predistortion signal from the predistortion unit 14. The subtractor 18 receives the feedback baseband signal from the amplifier model 17. The subtractor 18 calculates the difference between the predistortion signal and the feedback baseband signal, thereby generating the error signal. After that, the subtractor 18 outputs the calculated error signal to the amplifier model 17.

Figure 8:
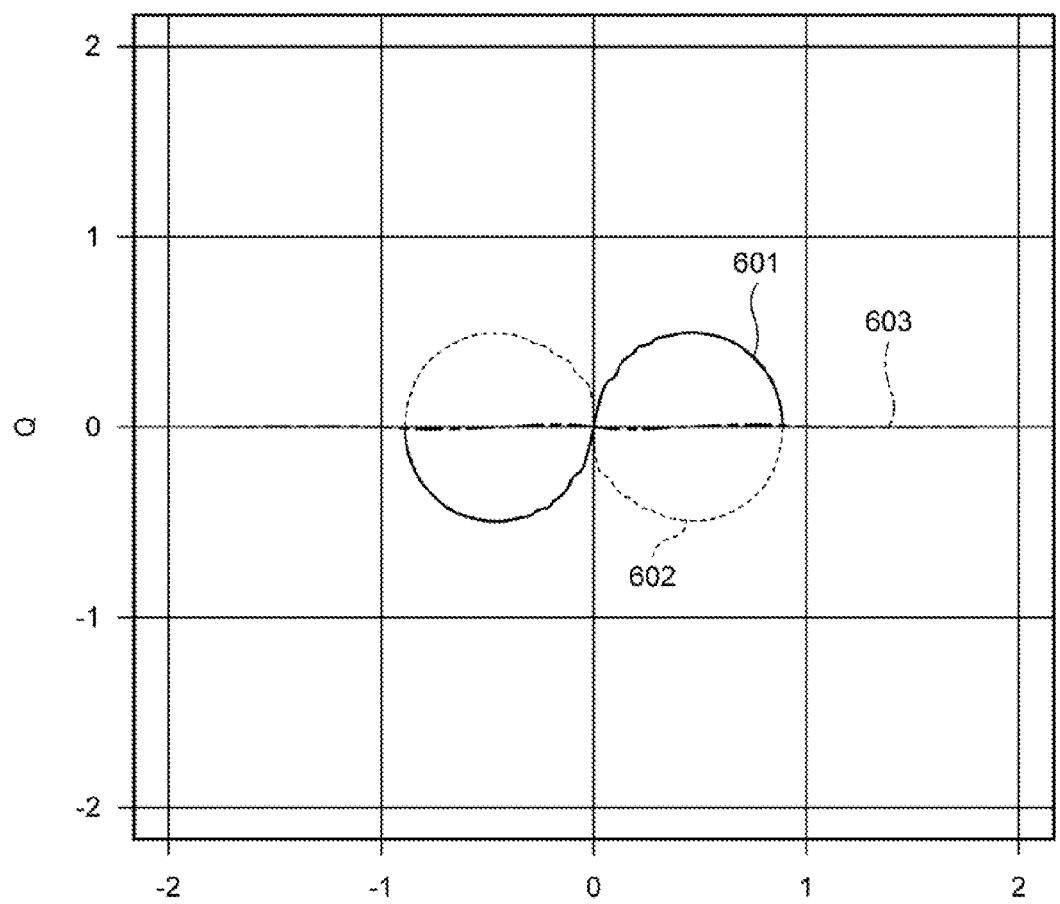
FIG. 8 is a constellation diagram of signals that are output from the respective amplifiers and a transmission signal when a two-tone signal is amplified by using the amplifier circuit according to the first embodiment.

FIG. 8 is a constellation diagram of signals that are output from the respective amplifiers and a transmission signal when a two-tone signal is amplified by using the amplifier circuit according to the first embodiment. The vertical axis of FIG. 8 is the Q component, and the horizontal axis is the I component. The first branch signal that is output from the amplifier 10 is expressed by a solid line 601. The second branch signal that is output from the amplifier 11 is expressed by a dotted line 602. The transmission signal that is generated by the combining unit 12 is expressed by a dashed-dotted line 603. Any of the solid line 601, the dotted line 602, and the dashed-dotted line 603 has almost no wave. In other words, it is found that ringing is suppressed in each of the first branch signal and the second branch signal, which are output from the respective amplifiers. It is also found that ringing is suppressed in the transmission signal that is generated by combining the first branch signal and the second branch signal together. Moreover, the shape of the combined transmission signal is closer to a straight line than the shape of the transmission signal, illustrated in FIG. 5, of the first embodiment. Therefore, the amplifier circuit of the present embodiment can reduce distortion more effectively than the amplifier circuit of the first embodiment. Therefore, the amplifier circuit of the present embodiment can reduce deterioration of the transmission signal that is an output radio frequency signal generated by combining the branch signals together more effectively than the amplifier circuit of the first embodiment.

Figure 9A:
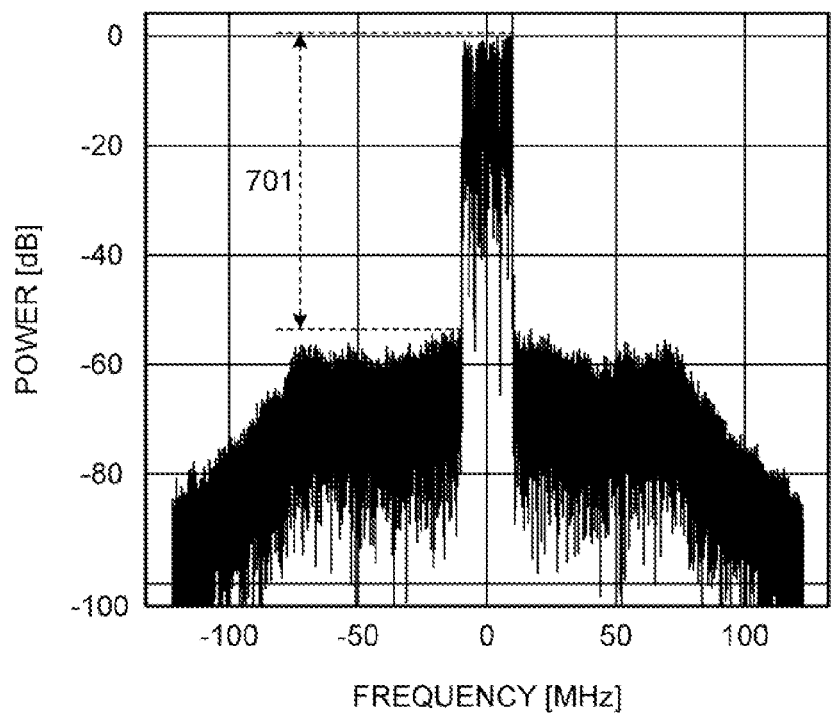
FIG. 9A is a graph of a spectrum of a transmission signal when a 4-carrier WCDMA signal is amplified by using the amplifier circuit according to the present embodiment.
Figure 9B:
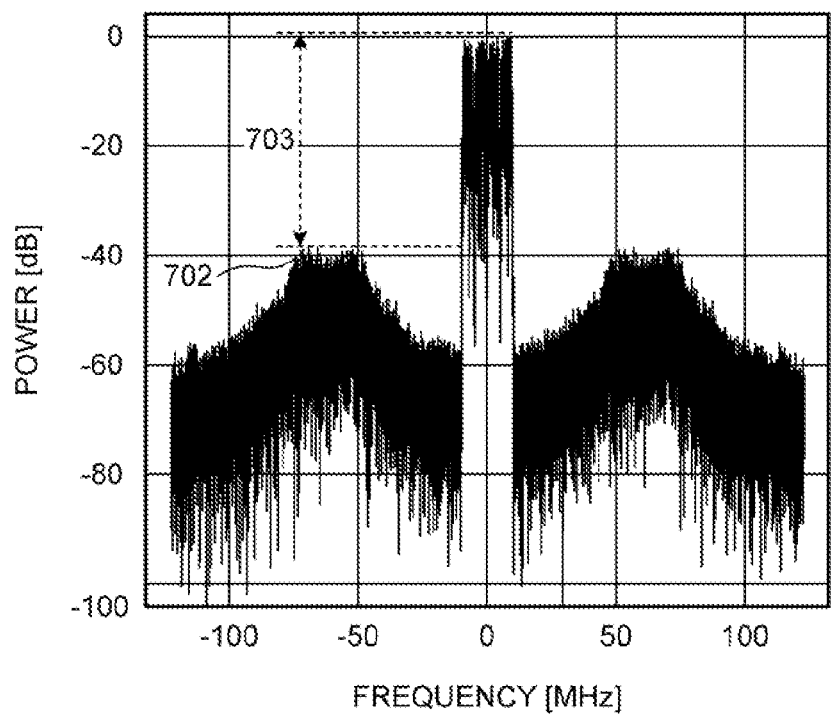
FIG. 9B is a graph of a spectrum of a transmission signal when a 4-carrier WCDMA signal is amplified by using the amplifier circuit according to the conventional LINC-based amplifier circuit.
Figure 10:
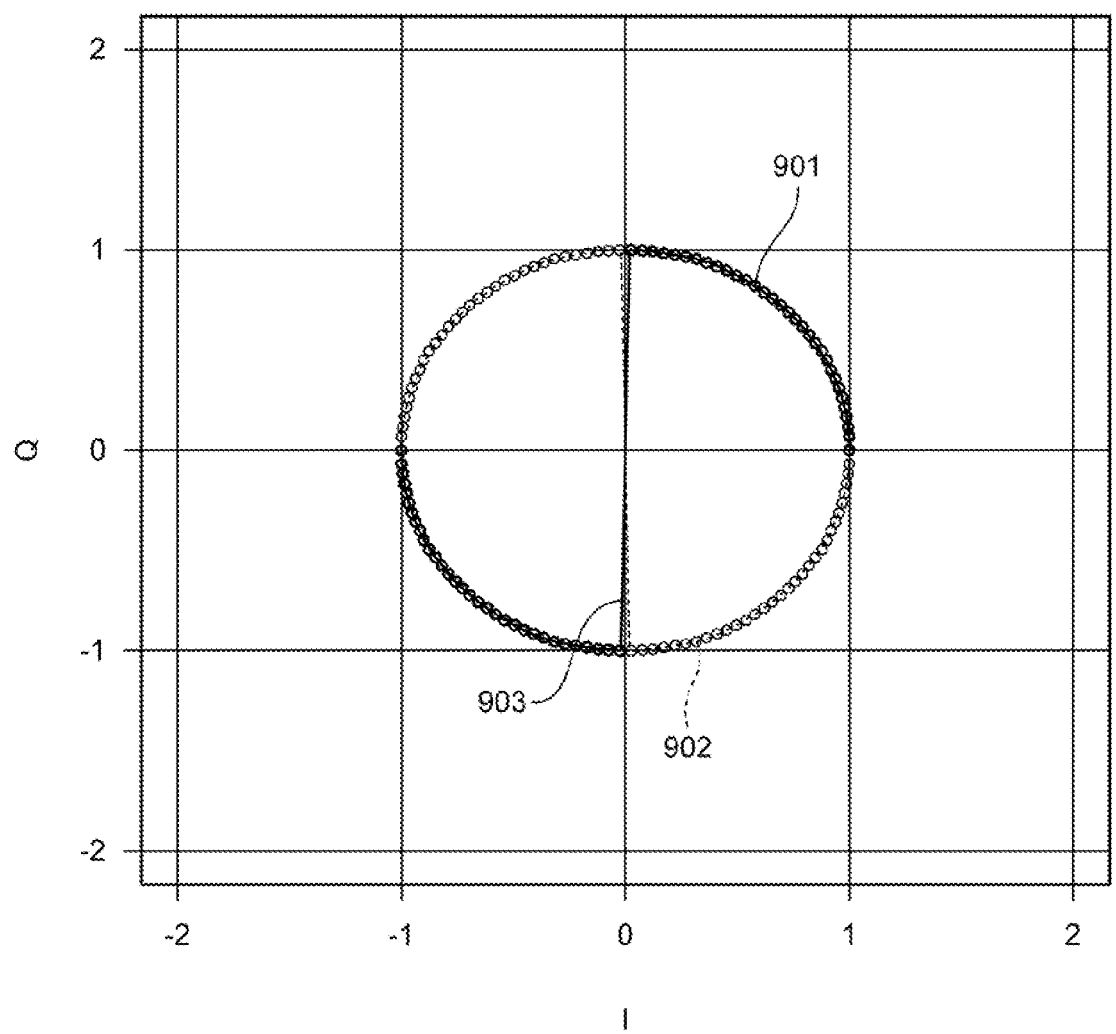
FIG. 10 is a constellation diagram of conventional branch signals when the input signal is a two-tone signal.
Figure 11:
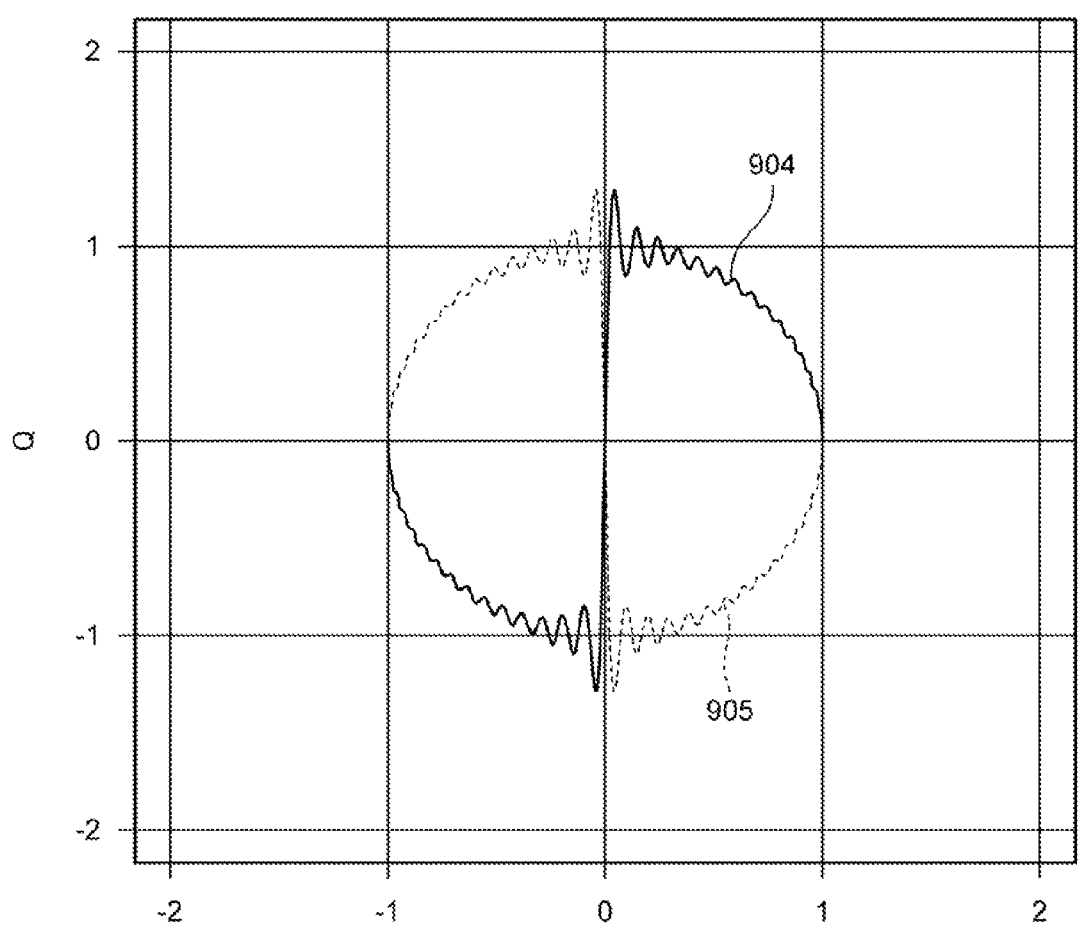
FIG. 11 is a constellation diagram of conventional signals that are input to amplifiers.
Figure 12:
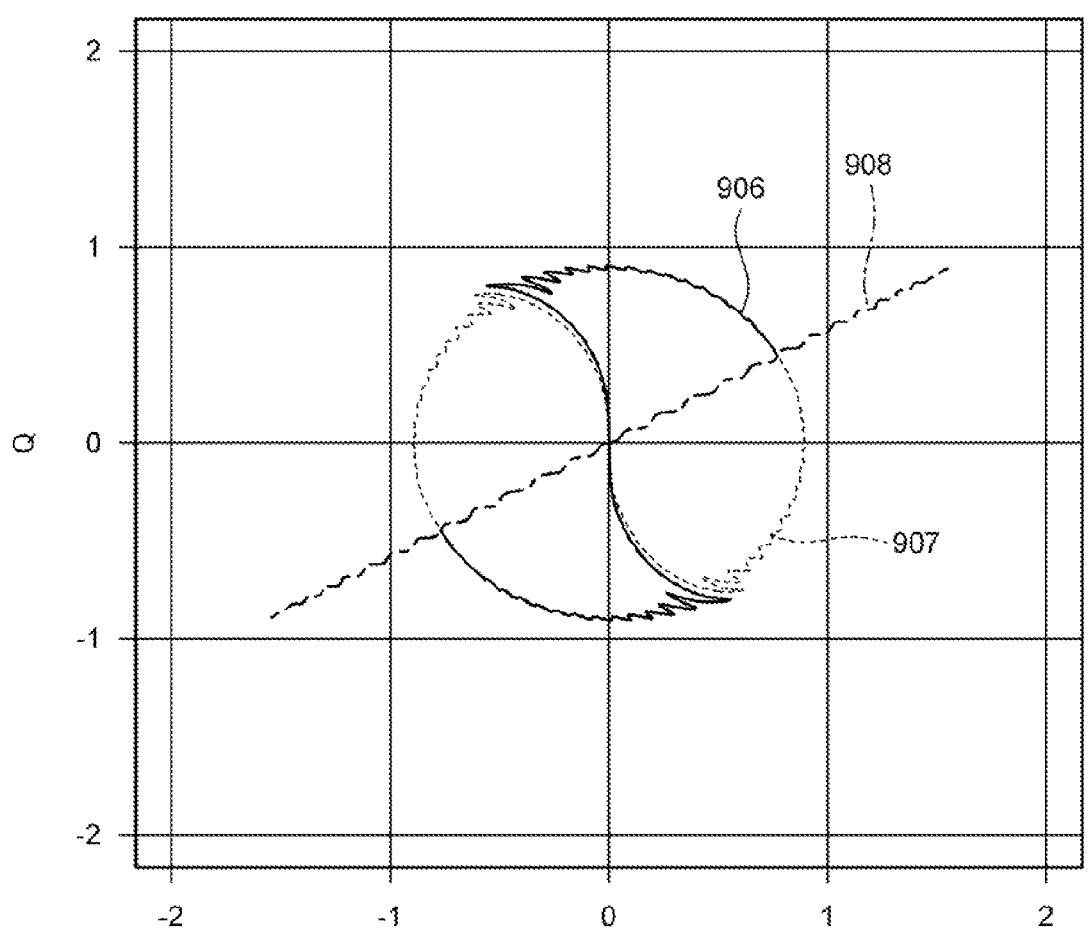
FIG. 12 is a constellation diagram of conventional signals that are output from the amplifiers and a conventional combined signal.
Figure 13:
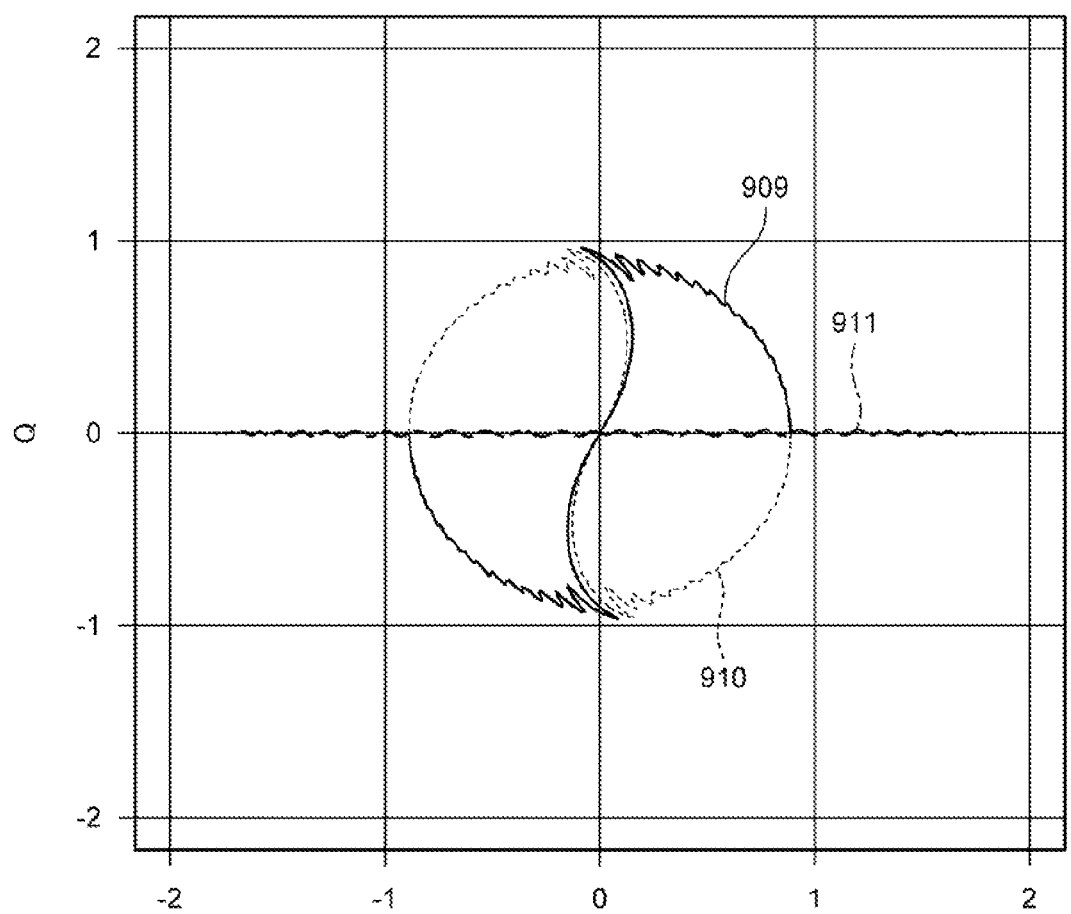
FIG. 13 is a constellation diagram of signals that are output from the amplifiers and a conventional combined signal when the conventional LINC-based amplifier circuit additionally has nonlinear compensation circuits.

FIG. 9A is a graph of a spectrum of a transmission signal when a 4-carrier WCDMA signal is amplified by using the amplifier circuit according to the present embodiment. FIG. 9B is a graph of a spectrum of a transmission signal when a 4-carrier WCDMA signal is amplified by using the amplifier circuit according to the conventional LINC-based amplifier circuit. The vertical axis of each of FIG. 9A and FIG. 9B is the power and the horizontal axis is the frequency. As illustrated in FIG. 9A, the amplifier circuit according to the present embodiment has a voltage difference 701 of about 55 dB between the frequency having the largest amplitude level and the amplitude level of another frequency band. In contrast, as illustrated in FIG. 9B, in the conventional LINC-based amplifier circuit, because of deterioration of the transmission signal caused by ringing, there occur frequency bands having large amplitudes, such as a point 702. Therefore, as illustrated in FIG. 9B, the conventional LINC-based amplifier circuit has a voltage difference 703 of about 40 dB between a frequency having the largest amplitude level and an amplitude level of another frequency band. In other words, the amplifier circuit according to the present embodiment can emphasize a signal to be transmitted more strongly than the conventional LINC-based amplifier circuit. As described above, the amplifier circuit according to the present embodiment can generate a more suitable transmission signal than a transmission signal of the conventional LINC-based amplifier circuit.

As described above, the amplifier circuit according to the present embodiment can perform distortion compensation and reduce ringing occurring in a branch signal that is input to an amplifier. Therefore, the amplifier circuit according to the present embodiment has, in addition to the effects of the amplifier circuit according to the first embodiment, an effect of reducing deterioration of the transmission signal more effectively than the amplifier circuit according to the first embodiment because distortion is suppressed more effectively.

Although, in the above explanation, distortion compensation is performed by using a nonlinear compensation circuit that is an indirect learning circuit, another distortion compensation method can be used. For example, a method can be used that involves performing predistortion even with a feedback signal, comparing the forward-side predistortion signal with the feedback-side predistortion signal, and calculating the error signal.

According to an aspect of the amplifier circuit, the transmitter, and the method of controlling the amplifier circuit of the present invention, a continuous branch signal is generated and distortion of an output radio frequency signal is suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An amplifier circuit comprising:
a signal separating unit that separates an input signal into a first branch signal and a second branch signal in such a manner that, as an amplitude of the input signal decreases, an amplitude of the first branch signal and the second branch signal decreases and the difference between a phase of the first branch signal and a phase of the second branch signal increases and, as the amplitude of the input signal increases, the amplitude of the first branch signal and the second branch signal increases and the difference between the phase of the first branch signal and the phase of the second branch signal decreases;
a first amplifier that amplifies the first branch signal;
a second amplifier that amplifies the second branch signal; and
a combining unit that combines signals that are output from the first amplifier and the second amplifier together, thereby generating an output signal,
wherein the signal separating unit includes
a parameter acquiring unit that acquires an amplitude and a phase value of the input signal,
an amplitude calculating unit that calculates an amplitude of a branch signal by using the amplitude of the input signal,
a phase calculating unit that calculates a phase amount of the first branch signal by using both the amplitude of the input signal and the amplitude of the branch signal that is calculated by the amplitude calculating unit,
a phase inverting unit that inverts the sign of the phase amount of the first branch signal, thereby calculating a phase amount of the second branch signal,
a multiplier that multiplies a unit vector and the amplitude of the branch signal together, wherein the unit vector has an amplitude 1 and a phase 0,
a first phase shifter that shifts the amplitude of the branch signal that is output from the multiplier by the phase amount of the first branch signal that is calculated by the phase calculating unit,
a second phase shifter that shifts the amplitude of the branch signal that is output from the multiplier by the phase amount of the second branch signal that is calculated by the phase calculating unit,
a third phase shifter that shifts a signal that is output from the first phase shifter by the phase value of the input signal, and
a fourth phase shifter that shifts a signal that is output from the second phase shifter by the phase value of the input signal.

2. The amplifier circuit according to claim 1, wherein when the input signal is $r \cdot \exp(j\theta)$ ($|r| \leq 1$) (r: amplitude, θ: phase value), the signal separating unit generates two branch signals: one being
$Sc1 = f(r)\exp(j(\theta + \cos^{-1}(r/f(r))))$, the other being
$Sc2 = f(r)\exp(j(\theta - \cos^{-1}(r/f(r))))$ where f(r) is a polynomial of r in which, as r comes closer to 0, f(r) comes closer to 0, and |f(r)|≤1.

3. The amplifier circuit according to claim 2, wherein the signal separating unit generates, by using α that has a predetermined value, two branch signals: one being
Sc1=$r^{1/\alpha}$exp(j(θ+cos−1(r/$r^{1/\alpha}$))), the other being
Sc2=$r^{1/\alpha}$exp(j(θ−cos−1(r/$r^{1/\alpha}$))).

4. A transmitter comprising:
a baseband processing unit that generates a baseband signal;
a signal separating unit that separates an input signal from the baseband processing unit into a first branch signal and a the second branch signal in such a manner that, as an amplitude of the input signal decreases, an amplitude of the first branch signal and the second branch decreases and the difference between a phase of the first branch signal and a phase of the second branch signal increases and, as the amplitude of the input signal increases, the amplitude of the first branch signal and the second branch signal increases and the difference between the phase of the first branch signal and the phase of the second branch signal decreases;
a first amplifier that amplifies the first branch signal;
a second amplifier that amplifies the second branch signal; and
a combining unit that combines signals that are output from the first amplifier and the second amplifier together, thereby generating an output signal and then transmits the output signal to an external device,
wherein the signal separating unit includes
a parameter acquiring unit that acquires an amplitude and a phase value of an input signal from the baseband processing unit,
an amplitude calculating unit that calculates an amplitude of a branch signal by using the amplitude of the input signal,
a phase calculating unit that calculates a phase amount of the first branch signal by using both the amplitude of the input signal and the amplitude of the branch signal that is calculated by the amplitude calculating unit,
a phase inverting unit that inverts the sign of the phase amount of the first branch signal, thereby calculating a phase amount of the second branch signal;
a multiplier that multiplies a unit vector and the amplitude of the branch signal together, wherein the unit vector has an amplitude 1 and a phase 0,
a first phase shifter that shifts the amplitude of the branch signal that is output from the multiplier by the phase amount of the first branch signal that is calculated by the phase calculating unit,
a second phase shifter that shifts the amplitude of the branch signal that is output from the multiplier by the phase amount of the second branch signal that is calculated by the phase calculating unit,
a third phase shifter that shifts a signal that is output from the first phase shifter by the phase value of the input signal, and
a fourth phase shifter that shifts a signal that is output from the second phase shifter by the phase value of the input signal.

5. A method of controlling an amplifier circuit, the method comprising:
separating an input signal into a first branch signal and a second branch signal in such a manner that, as an amplitude of the input signal decreases, an amplitude of the first branch signal and the second branch signal decreases and the difference between a phase of the first branch signal and a phase of the second branch signal increases and, as the amplitude of the input signal increases, the amplitude of the first branch signal and the second branch signal increases and the difference between the phase of the first branch signal and the phase of the second branch signal decreases;
amplifying the first branch signal by using a first amplifier;
amplifying the second branch signal by using a second amplifier; and
combining signals that are output from the first amplifier and the second amplifier together, thereby generating an output signal,
wherein the separating includes
acquiring an amplitude and a phase value of an input signal,
first calculating an amplitude of a branch signal by using the amplitude of the input signal,
second calculating a phase amount of a first branch signal by using both the amplitude of the input signal and the amplitude of the branch signal that is calculated by the first calculating,
inverting the sign of the phase amount of the first branch signal, thereby calculating a phase amount of a second branch signal,
multiplying a unit vector and the amplitude of the branch signal together, wherein the unit vector has an amplitude 1 and a phase 0,
a first shifting the amplitude of the branch signal that is output by the multiplying by the phase amount of the first branch signal that is calculated by the second calculating,
a second shifting the amplitude of the branch signal that is output from the multiplying by the phase amount of the second branch signal that is calculated by the second calculating,
a third shifting a signal that is output by the first shifting by the phase value of the input signal, and
a fourth shifting a signal that is output by the second shifting by the phase value of the input signal.

6. An amplifier circuit comprising:
a processor, a memory, a first amplifier, and a second amplifier, wherein the processor executes:
separating an input signal into a first branch signal and a second branch signal in such a manner that, as an amplitude of the input signal decreases, an amplitude of the first branch signal and the second branch signal decreases and the difference between a phase of the first branch signal and a phase of the second branch signal increases and, as the amplitude of the input signal increases, the amplitude of the first branch signal and the second branch signal increases and the difference between the phase of the first branch signal and the phase of the second branch signal decreases;
combining signals that are output from the first amplifier and the second amplifier together, thereby generating an output signal;
the first amplifier executes amplifying the first branch signal; and
the second amplifier executes amplifying the second branch signal
wherein the separating includes
acquiring an amplitude and a phase value of an input signal,
first calculating an amplitude of a branch signal by using the amplitude of the input signal,
second calculating a phase amount of a first branch signal by using both the amplitude of the input signal and the amplitude of the branch signal that is calculated by the first calculating, inverting the sign of the phase amount of the first branch signal, thereby calculating a phase amount of a second branch signal, multiplying a unit vector and the amplitude of the branch signal together, wherein the unit vector has an amplitude 1 and a phase 0, a first shifting the amplitude of the branch signal that is output by the multiplying by the phase amount of the first branch signal that is calculated by the second calculating, a second shifting the amplitude of the branch signal that is output from the multiplying by the phase amount of the second branch signal that is calculated by the second calculating, a third shifting a signal that is output by the first shifting by the phase value of the input signal, and a fourth shifting a signal that is output by the second shifting by the phase value of the input signal.

* * * * *